United States Patent [19]
Ngo et al.

[11] Patent Number: 5,349,253
[45] Date of Patent: Sep. 20, 1994

[54] LOGIC TRANSLATOR INTERFACING BETWEEN FIVE-VOLT TTL/CMOS AND THREE-VOLT CML

[75] Inventors: Tuan V. Ngo, Eden Prairie; John J. Price, Jr., Edina, both of Minn.

[73] Assignee: VTC Inc., Bloomington, Minn.

[21] Appl. No.: 992,544

[22] Filed: Dec. 17, 1992

[51] Int. Cl.$^5$ .......................................... H03K 19/018
[52] U.S. Cl. ................................. 307/475; 307/455; 307/443
[58] Field of Search .............. 307/455, 443, 475, 494, 307/557, 558, 296.6

[56] References Cited

U.S. PATENT DOCUMENTS

| | | | |
|---|---|---|---|
| 4,350,906 | 9/1982 | Gillberg | 307/443 |
| 4,910,425 | 3/1990 | Ohba et al. | 307/557 |
| 5,013,941 | 5/1991 | Jansson | 307/455 |
| 5,025,180 | 6/1991 | Kim et al. | 307/475 |
| 5,134,309 | 7/1992 | Matsumoto et al. | 307/475 |

Primary Examiner—Edward P. Westin
Assistant Examiner—Benjamin D. Driscoll
Attorney, Agent, or Firm—Kinney & Lange

[57] ABSTRACT

A logic translating buffer for low voltage operation for receiving a TTL compatible signal and providing a current mode logic signal. The logic translating buffer includes an emitter coupled differential pair of NPN transistors with the common emitters each being connected to a current source. One of the transistors of the differential pair has a constant voltage bias applied to the base thereof that is equal to the sum of a forward biased PN junction, a forward biased Schottky diode, and the voltage drop across a first resistor. The other transistor of the differential pair is provided a signal that is representative of the logic level input to the translating buffer. A clamping transistor is provided for keeping the other transistor of the differential pair from saturating.

30 Claims, 2 Drawing Sheets

LOGIC TRANSLATOR INTERFACING BETWEEN FIVE-VOLT TTL/CMOS AND THREE-VOLT CML

BACKGROUND OF THE INVENTION

The present invention relates to a buffer for interfacing a signal to a device and, in particular, to a buffer that is capable of interfacing between a TTL compatible output signal provided by a device operated with a five volt nominal supply voltage and a device suited for operation with a supply voltage that is substantially less than five volts, e.g. 2.5 volts.

A buffer is used in digital logic assemblies to provide a separation in impedance between logic elements. Buffers are frequently used in combination with logic elements as part of an integrated circuit (IC). These integrated circuits make use of an input buffer for receiving logic signals from other assemblies and output buffers for transmitting logic signals to other logic assemblies.

Input buffers that are part of an integrated circuit are frequently used to interface relatively low logic impedance elements with logic elements that have relatively high impedance. These low impedance elements are often output buffers that are capable of driving loads that have relatively low input impedance. In contrast, the high impedance elements are frequently logic elements that have high input impedance and are part of the integrated circuit. These input buffers may also provide additional features such as electrostatic discharge protection for preventing relatively large voltages on the logic inputs from damaging the integrated circuit. In addition, input buffers are frequently capable of interpreting an electrically unconnected input or "floating" input to the integrated circuit as a predefined logic state. For example, TTL input buffers frequently make use of a pull down resistor so that a floating input is interpreted as a logic low state.

When interfacing between digital logic assemblies of different families, it is often necessary that a level shifter or translator circuit be used. Each of these families of integrated circuits, such as complementary-metal-oxide-semiconductor (CMOS), transistor-transistor logic (TTL) and emitter coupled logic (ECL) have characteristic parameters for logic high and logic low states. Therefore, the translator or level shifter must be capable of accepting the voltage or current levels from one logic family and providing the appropriate voltage and current levels for the second integrated circuit family for which the translator is providing an interface.

FIG. 1 shows a prior art input buffer 10 that operates with a five volt nominal supply voltage. Input buffer 10 includes an input terminal 12 for receiving a TTL compatible signal from a device operating with a five-volt nominal supply voltage. Input buffer 10 further includes a pair of output terminals 14 and 16 for providing a differential current mode logic (CML) signal for a device operating at a five volt nominal supply. Signals present at output terminals 16 and 14 represent the positive or true output signal and the negative or complement output signal, respectively. The positive side of the supply voltage is connected to a terminal 18 and the negative side of the supply voltage is connected to a terminal 20.

Input buffer 10 includes a switch control transistor 22 that receives a signal at the input terminal 12 and provides a control signal for operating a current switch circuit. The current switch circuit includes a pair of transistors 24 and 26 that are connected in a common emitter configuration to a current source transistor 28. Each of transistors 24, 26 and current source transistor 28 have an emitter, base and collector.

A constant polarity voltage bias is applied between the base and emitter of current source transistor 28. The current source transistor 28 is biased by resistor 30, diode 32, transistor 34 and resistor 36 each connected in series between the positive terminal 18 and the negative terminal 20. Transistor 34 has a base and a collector that are electrically connected together to form a PN junction between the collector and an emitter.

The bias voltage applied to the base of current source transistor 28 is equal to a forward bias voltage drop across the PN junction of transistor 34 plus a voltage drop across resistor 36 resulting from a current passing therethrough. Resistor 36 is selected such that the bias current that passes between the positive terminal 18 and negative terminal 20 through resistor 36 causes a voltage drop of approximately 700 millivolts to occur across the resistor 36. Therefore, the bias voltage provided between the base of transistor 28 and the negative terminal 20 is approximately equal to 700 millivolts plus the 700 millivolt forward bias voltage drop across transistor 34, or 1.4 volts. The bias voltage applied to the base of transistor 28 is constant as long as the voltage between terminals 18 and 20 is constant.

This bias voltage applied to the base of current source transistor 28 forward biases the base-emitter junction so that current is conducted between the collector and the emitter of the current source transistor 28. In this manner, current source transistor 28 conducts or sinks current provided by each of the emitters of transistors 24 and 26.

Transistor 26 has a bias voltage applied between its base and the negative terminal 20 that is equal to the sum of the bias voltage applied to the base of the current source transistor 28 plus the forward bias voltage drop across diode 32. The forward bias voltage drop across diode 32 is approximately 700 millivolts. Therefore, the bias voltage applied to transistor 26 is approximately equal to 2.1 volts or the forward bias voltage drop of three PN junction diodes connected in series. The bias voltages applied to transistor 26 are relatively constant as long as the supply voltage applied between terminals 18 and 20 is constant. The bias voltage applied to transistor 26 sets the voltage threshold level at which transistor 26 transitions from a conducting state where current is conducted between the collector and the emitter and a non-conducting state where current is substantially prevented from passing between the collector and the emitter. Transistor 26 is in the conducting state when the voltage between the base and emitter is sufficiently large so that a PN junction between the base and emitter is forward biased. Conversely, transistor 26 is in the non-conducting state when the PN junction between the base and the emitter, respectively, is reverse biased.

Transistor 24 has a conducting state and a non-conducting state similar to transistor 26. Transistor 24 is in a conducting state if a PN junction between the base and emitter is forward biased and in a non-conducting state if the PN junction is reverse biased.

Transistors 24 and 26 together form a symmetrical current switch for providing current to the current source transistor 28. The base of transistor 24 is connected to the emitter of the switch control transistor 22. As the voltage at the emitter of the switch control transistor 22 varies between relatively high voltages and relatively low voltages, the operation of transistor 24 varies between conducting and non-conducting states. If the voltage provided by switch control transistor 22 to the base of transistor 24 is sufficiently large, then transistor 24 is in the conducting state. If the voltage applied to the base of transistor 24 by switch control transistor 22 is not large enough so that transistor 24 is in the conducting state, then only transistor 26 will be in the conducting state.

Because transistors 24 and 26 are connected in a common emitter configuration, voltages applied to the base of transistor 24 also affect the operation of transistor 26. If the voltage provided to the base of transistor 24 is sufficiently large, the voltage at the common emitter of transistors 24 and 26 rises so that transistor 26 is no longer forward biased and is therefore not in the conducting state.

The current conducted by both transistors 24 and 26 will have an inverse relationship that results from the common emitter configuration. Therefore, as the current conducted between the collector and emitter of transistor 24 increases, the current conducted between the collector and the emitter of transistor 26 decreases. Conversely, as the current conducted between the collector and the emitter of transistor 24 decreases, the current conducted between the collector and emitter of transistor 26 increases. The current that enters the collector of current source transistor 28 is equal to the sum of the currents provided by the emitter of transistors 24 and 26.

Transistor 24 and transistor 26 are each connected to separate collector circuits. The current provided by the emitter of transistor 24 is substantially the same as the current passing through a resistor 38 that is electrically connected between the positive terminal 18 and the collector of transistor 24 except for a small current entering the base of transistor 24. Similarly, the current provided by the emitter of transistor 26 is substantially the same as the current passing through resistor 40 that is electrically connected between the positive terminal 18 and the collector of transistor 26, except for a small current entering the base of transistor 26.

The voltage at the output terminals 14 and 16 are related to current entering the collector of transistors 24 and 26, respectively. The output terminals 14 and 16 each has an output voltage present that is equal to the voltage at the positive supply terminal 18 minus the voltage drop across the resistors 38 and 40, respectively, that are electrically connected between the positive supply 18 and the output terminals. Therefore, the voltage at output terminal 14 relative to terminal 20 is equal to the voltage at positive terminal 18 minus the product of the resistance of resistor 38, in ohms, and the current entering the collector of transistor 24. Similarly, the voltage at output terminal 16 is equal the voltage at the positive terminal 18 minus the product of the resistance of resistor 40, in ohms, and the current entering the collector of transistor 26. If transistors 24 and 26 are matched and resistors 38 and 40 are identical, then the voltage swing at output terminals 14 and 16 will be the same.

The switch control transistor 22 is biased through resistor 46 that is connected between an emitter and the positive terminal 18. The bias on switch control transistor 22 allows the voltage at the emitter to track the voltage at the base. The emitter of switch control transistor 22 is level-shifted from the voltage at the base by the forward bias voltage drop of the emitter-base junction. The switch control transistor 22 selects the source of current provided to current source transistor 28 based on the signal at input terminal 12. If the voltage between the input terminal 12 and the negative terminal 20 is in a logic low state, then the emitter-base are forward biased and switch control transistor 22 is in a conducting state. When in the conducting state, current passes from the positive terminal through resistor 46 causing a voltage drop across resistor 46 thereby reducing the voltage at the base of transistor 24. If the voltage at the base becomes sufficiently reduced, transistor 24 becomes non-conducting.

Alternatively, resistor 46 may be replaced by a PNP transistor having an emitter connected to the positive terminal 18, a collector connected to the emitter of transistor 22 and a base connected to a bias or current source. In this arrangement, the PNP transistor provides bias current to transistor 22 as well as base current to transistor 24 in a manner similar to resistor 46.

If the voltage between the input terminal 12 and the negative terminal 20 is in a logic high state, then the emitter-base are reverse biased and switch control transistor 22 is in a non-conducting state. When in the non-conducting state, very little current, if any, flows through resistor 46 thereby causing the voltage at the base of transistor 24 to be pulled up to or nearly equal to the positive terminal 18 voltage. When the voltage at the base of transistor 24 becomes sufficiently large, the transistor 24 will be in the conducting state. As will be discussed, a clamping transistor 48 prevents the voltage at the base from becoming too large thereby preventing the saturation of transistor 24.

A clamping transistor 48, having a base, an emitter and a collector, is provided to prevent the transistor 24 from saturating and thereby providing a non-symmetrical signal at output terminals 14 and 16. The clamping transistor 48 is connected so that the emitter is connected to the base of transistor 22 and the collector connected to the negative terminal 20. The clamping transistor prevents saturation of the transistor 24 by conducting current between the collector and emitter thereby limiting the voltage at the base of transistor 24. The clamping threshold or voltage at the base of transistor 24 for which the clamping transistor 48 conducts is set by the voltage at the base of clamping transistor 48. If the voltage at the emitter of transistor 48 is sufficiently large relative to the voltage drop across the series combination of diode 32, diode 34 and the voltage across resistor 36 due to the current flowing therethrough, then the emitter-base becomes forward biased and transistor 48 conducts limiting or clamping the positive voltage excursion at the base of transistor 24.

A degeneration resistor 42 is connected between the emitter of current source transistor 28 and the negative terminal 20. Emitter degeneration resistors are known and are used in common emitter amplifiers to provide feedback increasing voltage stability as well as increasing both the input impedance and output impedance. The emitter degeneration resistor 42 also increases the range of voltages supplied at input terminal 12 over which the voltage at output terminals 14 and 16 behaves in a linear fashion. Finally, the degeneration resistor 42 sets the transition time for the voltage swing at the output terminals 14 and 16 by setting the current passing through current source transistor 28.

Resistor 52 is a pull-down resistor for pulling the voltage at the base of switching transistor 22 low or toward the voltage of the negative terminal 20 if the input terminal 12 is in a floating state. An input resistor 44 is connected between input terminal 12 and the switch control transistor 22 for limiting large in-rush currents such as those caused by an electrostatic discharge. Epitaxial connections 60 and 62 are made between the positive terminal 18 and each of resistors 52 and 44.

Buffer 10 requires that the supply voltage be sufficiently large so that transistor 24 is in the conducting state when a logic high signal is provided to input terminal 12. To ensure transistor 24 conducts in this condition, the supply voltage must be greater than the bias voltage applied to the base of transistor 48, 2.1 volts, plus the forward bias voltage drop of the PN junction between the base and emitter of transistor 48, 0.7 volts. Therefore, the supply must be greater than 2.8 volts to ensure transistor 24 achieves the proper voltage swing and that clamping transistor 48 is in the conducting mode when transistor 24 is conducting maximum current. However, because the forward bias voltage drop for both the base emitter junctions of transistors 48 and 34 and the diode 32 have large temperature coefficients under worst case temperature conditions, the minimum supply voltage must be much greater than 2.8 volts. Under worst case temperature conditions, the voltage drop across the emitter base junctions for transistors 48 and 34 and across diode 32 is approximately 0.85 volts each. Therefore, under worst case temperature conditions, the minimum supply voltage is approximately 3.25 volts. Therefore, buffer 10 does not readily lend itself to low supply voltage operation because an adequate voltage swing at the base of transistor 24 cannot be achieved at low supply voltages.

There is a present need for input buffers for integrated circuits of one logic family to interface with logic elements of another family that are capable of operation with a low supply voltage. These input buffers should be reliable, able to allow the voltage at the input terminal to be grater than the supply voltage and provide fast transition times between states.

SUMMARY OF THE INVENTION

The present invention is a logic translator suited for low voltage operation. The logic translator includes a first input terminal for receiving an input signal having an input signal voltage relative to a common reference terminal. A reference voltage means is included for providing a reference voltage relative to the common reference terminal at a first reference voltage terminal. The reference voltage provided by the reference voltage means is less than three diode drops.

Included are first and second transistors connected in a common emitter configuration between a supply terminal and the common reference terminal. The base of the first transistor is connected to the first reference voltage terminal. A current source means is provided that includes at least one transistor that is connected between the supply terminal and the base of the second transistor. This transistor provides a current between the supply terminal and the second transistor. Also included is a switching means connected to the first input terminal and the base of the second transistor. The switching means allows current to pass between the current source means and the common terminal based on the first input terminal voltage. Also included is at least one output terminal for providing an output voltage based on one of the first and second transistor currents.

In one preferred embodiment of the logic translator of the present invention, there is included a first input terminal for receiving an input signal having an input signal voltage relative to a common reference terminal. Also included is a voltage reference means for providing a reference voltage relative to the common reference terminal at a first reference terminal.

Included are first and second transistors connected in a common emitter configuration between a supply terminal and the common reference terminal. The base of the first transistor is connected to the first reference terminal. A voltage clamp transistor is provided that is connected between the base of the second transistor and the common reference terminal. The emitter-base junction of the voltage clamp transistor is connected between the base of the second transistor and the first reference terminal.

A voltage drop means is also provided that is connected between the base of the first transistor and the first reference terminal. The voltage drop means provides a voltage drop thereacross so that a voltage between the bases of the first and second transistors is less than one diode drop. A switching means is included that is connected to the second transistor for providing current to the second transistor based on the input signal voltage. Also included is at least one output terminal for providing an output voltage based on one of the first and second transistor currents.

Another preferred embodiment of the present invention is a logic translator suited for low supply voltage operation. The logic translator is capable of receiving a TTL compatible signal and providing a current mode logic signal based on the TTL signal. The logic translator includes a first input terminal for receiving the TTL compatible signal having a TTL compatible signal voltage relative to a common reference terminal. The logic translator also includes a voltage reference means for providing a reference voltage relative to the common reference terminal at a first reference voltage terminal. The reference voltage has a magnitude that is less than three diode drops.

A current switch means is provided for selectively allowing current to flow in a first and second collector circuit. The current switch includes a first and second NPN transistor that each have emitters connected together. Each of the first and second NPN transistors also have a base. The first NPN transistor has a collector that is connected to the first collector circuit and the second NPN transistor has a collector that is connected to the second collector circuit. The base of the second NPN transistor is connected to the reference voltage means.

A third transistor is provided that has first and second controlled terminals and a control terminal. The first and second controlled terminals are connected between the common reference terminal and the emitters of each of the first and second NPN transistors. A control means provides a control signal to the control terminal of the third transistor thereby allowing a current to pass between the first and second controlled terminals of the third transistor.

The logic translator further includes a switching means that is connected to the first input terminal and the base of the first NPN transistor. The switching means provides a base drive signal to the base of the first NPN transistor based on the TTL compatible signal voltage thereby selectively allowing current to pass between the collector and emitter of the first NPN transistor. This collector-to-emitter current flow produces the current mode logic signal at the collector of one of the first NPN transistors or the second NPN transistors.

DETAILED DESCRIPTION OF THE PREFERRED EMBODIMENTS

Figure 2:
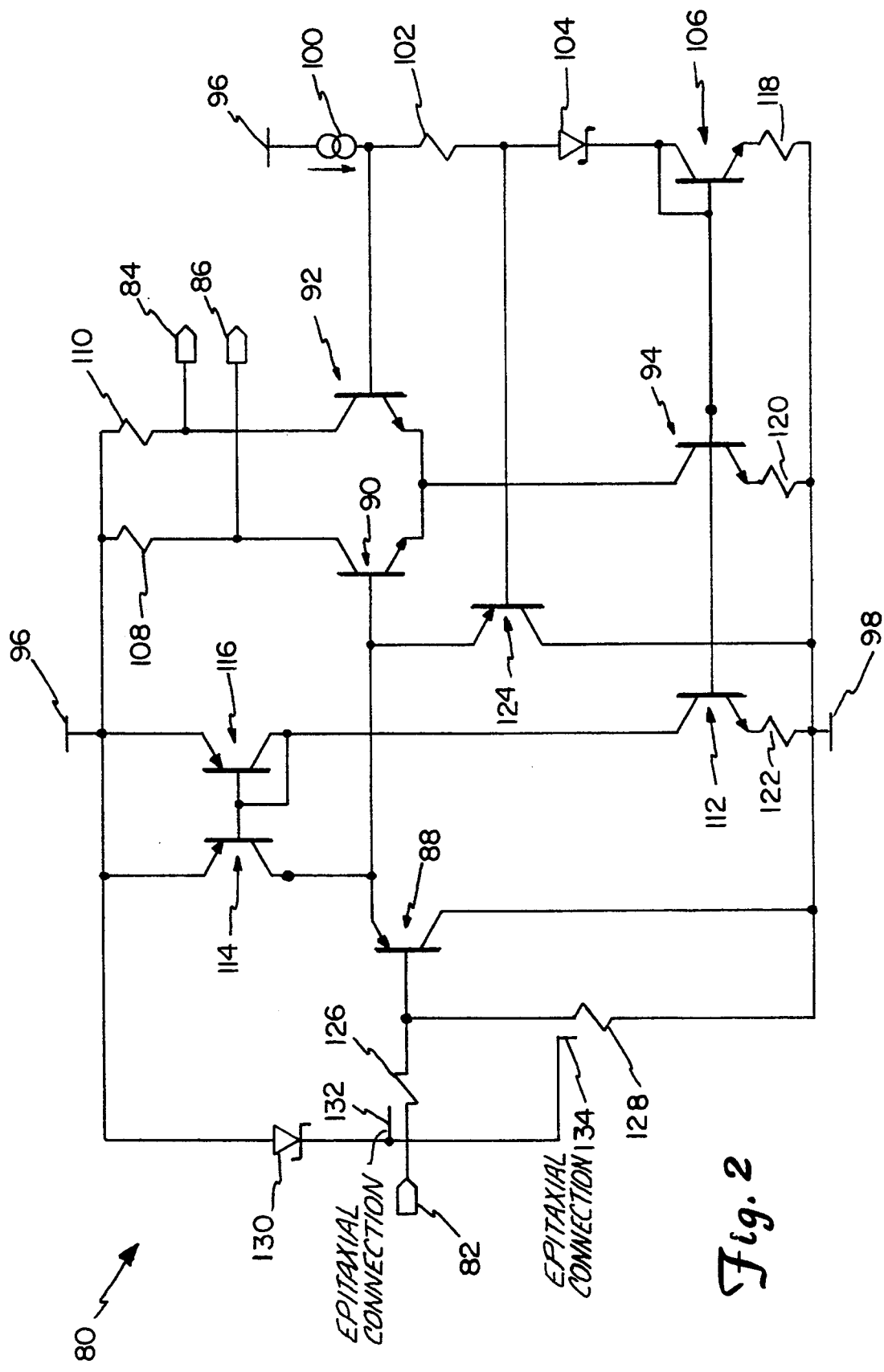
FIG. 2 is an electrical schematic diagram of an embodiment of the logic translator of the present invention which is suited for operation with a low supply voltage.

FIG. 2 is a schematic diagram of a preferred embodiment of the logic translating buffer 80 of the present invention that is suited for low supply voltage operation. The logic translator 80 has an input terminal 82 for receiving a TTL compatible signal and has a pair of output terminals 84 and 86 for providing a differential or true and complement current mode logic (CML) signals.

Buffer 80 includes a switch control transistor 88, having an emitter, a base and a collector. The switch control transistor 88 provides a control signal to a current switch made up of transistors 90, 92 and 94, each having an emitter, base and collector. Transistor 94 provides a constant current source for transistors 90 and 92. Transistors 90 and 92 are connected in a common emitter configuration with the emitters electrically connected to the collector of transistor 94. Transistor 92 is biased by a supply voltage that is provided between a positive terminal 96 and a negative terminal or a common terminal 98.

A bias source is provided by a current source 100, a resistor 102, a Schottky diode 104 and a transistor 106. The buffer 80 of the present invention is suited for operation with the supply voltage in a range from 2.5 volts to 5.5 volts. As will be discussed, it is the ability to operate at low supply voltages that is a primary advantage of the present invention. The current source 100 is connected between the positive terminal 96 and each of the resistor 102 and the base of transistor 92. A current provided by the current source 100 is provided to the resistor 102, and both the Schottky diode 104 and the transistor 106 which are connected in series with the current source 100. Transistor 106 has an emitter electrically connected to the common terminal 98 with a collector electrically connected to each of a cathode of Schottky diode 104 and a base of transistor 106. Resistor 102 is selected to have a resistance value such that approximately 400 millivolts is dropped thereacross when a bias current is established between the current source 100 and the common terminal 98.

A bias voltage is provided between the base of transistor 92 and the common reference terminal 98 as a result of the bias current provided by current source 100. The current source 100 is a conventional current source that in one preferred embodiment is a known current mirror circuit that provides a forward biased voltage drop of 700 millivolts thereacross. This bias voltage at the base of transistor 92 is equal to the sum of the voltage drops across each of the series elements, resistor 102, Schottky diode 104, transistor 106 and a resistor 118. The voltage drop resulting from the bias current provided by the current source 100 is approximately 600 millivolts for Schottky diode 104 and 700 millivolts for the PN junction between the base and the emitter of transistor 106. The voltage drop across the resistor 118, connected between the emitter of transistor 106 and common terminal 98, is small relative to the voltage drops across resistor 102, Schottky diode 104 and transistor 106. Therefore, the voltage drop across resistor 118 can be left out of the bias voltage computation without significant error. In one preferred embodiment, the voltage drop across resistor 118 is 100 millivolts. The function of this resistor will be more fully discussed below. Therefore, the bias voltage applied between the base of transistor 92 and the common terminal 98 is approximately 1.80 volts.

The emitter voltage of the switch control transistor 88 tends to track the voltage at the input terminal 82 thereby providing a changing voltage at the base of transistor 90. As the base voltage on transistor 90 varies, transistor 90 varies between a conducting state wherein current is conducted between the collector and the emitter, and a non-conducting state wherein little current is conducted between the collector and the emitter. The details of how transistor 90 is driven between the conducting state and the non-conducting state are more fully described later.

As transistor 90 varies between the conducting state and the non-conducting state, the source of current supplied to current source transistor 94 will vary between transistor 90 and transistor 92. If transistor 90 is supplying substantially all of the current to current sink transistor 94, then a voltage drop across a resistor 108 connected between the positive terminal and the collector of transistor 90 causes voltage at output terminal 86 to be in a logic low state. This low voltage state is equal to the voltage provided between the positive terminal 96 and the negative terminal 98 minus the product of the current entering the collector of transistor 90 times the resistance of the resistor 108. At the same time transistor 90 is supplying substantially all of the current to current source 94, transistor 92 is supplying substantially none of the current to current source 94. Because transistor 92 is conducting very little current, there is very little current passing through a resistor 110 connected between the positive terminal 96 and the collector of transistor 92. Therefore, the voltage at output terminal 84 is pulled up to, or nearly to, the voltage of the positive terminal 96.

As transistor 90 transitions from a conducting state to a non-conducting state, transistor 92 transitions from a non-conducting state to a conducting state. If the voltage at the base of transistor 90 is sufficiently low, then transistor 92 supplies substantially all of the current while transistor 90 provides substantially none of the current to current source transistor 94. When this occurs, output terminal 84 is a logic low and has a voltage equal to the voltage provided between the positive terminal 96 and the common terminal 98 minus the product of the current entering the collector of transistor 92 times the resistance of resistor 110. Output terminal 86 at this time will be a logic high and will have a voltage that is equal to, or nearly equal to, the voltage between the positive terminal 96 and the common terminal 98. In this manner, a current mode logic or differential output is provided at output terminals 84 and 86 with output terminal 84 being a true output and output terminal 86 being a complement of the true output. Although the logic translator is described as having a differential output provided between output terminals 84 and 86, only one of these output terminals is necessary for interfacing with devices such as a single ended input devices.

Switch control transistor 88 is biased by a current mirror arrangement made up of transistors 112, 114 and 116. Each of transistors 112, 114 and 116 have a collector, base and emitter. Transistor 112 has an emitter connected to the common terminal 98 and a base connected to the base of transistor 106. The emitter of transistor 116 is connected to the positive terminal 96 with each of the base and collector being connected to the collector of transistor 112. Transistor 114 has an emitter connected to the positive terminal 96, the collector connected to the emitter of transistor 88 and the base connected to the base and collector of transistor 116.

This arrangement results in a relationship between the current passing between the collector and emitter for each of transistors 112 and 106. In addition, the current passing between the emitter and collector of transistor 114 is related to the current passing between the emitter and collector of transistor 116. Because the current passing between the emitter and collector of transistor 116 is substantially the same as the current passing between the collector and emitter of transistor 112, the current passing between the emitter and collector of transistor 114 is related to the current passing between the collector and emitter of transistor 106 and is independent of the supply voltage between terminals 96 and 98.

In one preferred embodiment, resistors 118, 120 and 122 are connected between the emitters of transistors 106, 94 and 112, respectively, and the negative terminal 98 for helping to control current ratios between transistors 106 and 94 and transistors 106 and 112. These current ratios may be set or controlled by other known methods such as sizing the emitter-base junction areas to the desired ratio without the use of resistors 118, 120 and 122, or the use of a combination of emitter-base junction area sizing and degeneration resistors 118, 120 and 122.

A bias current is provided to the emitter of transistor 88 by the collector of transistor 114. This bias current is provided to transistor 90 to keep transistor 90 in a conducting state when the voltage at input terminal 82 is sufficiently high so that transistor 88 is in a non-conducting state. In this manner, transistor 88 becomes non-conducting and effectively isolates input terminal 82 from the base of transistor 90. This bias current provided by transistor 114 is relatively constant and independent of variation in the supply voltage.

A voltage limiter or clamp is provided by a transistor 124 that has an emitter connected to the base of transistor 90 and a collector connected to the negative terminal 98 and a base connected to an anode of Schottky diode 104. The voltage clamp, as discussed previously, prevents the transistor 90 from saturating. Transistor 124 has a bias voltage applied between the base and the common terminal 98 that is equal to the forward bias voltage drop of Schottky diode 104 plus the forward bias voltage drop of the PN junction of transistor 106. The voltage drop across the PN junction of transistor 106 is approximately 700 millivolts and the voltage drop at the Schottky diode is approximately 600 millivolts. Therefore, the bias applied to transistor 124 is approximately 1.30 volts.

The clamp transistor 124 conducts current between the collector and the emitter when the base voltage of transistor 90 is approximately 300 millivolts greater than the base voltage at which transistor 90 conducts current between the collector and the emitter. The voltage swing at the bases of transistors 90 and 92 is equal to the 700 millivolt emitter-base voltage of transistor 118 minus the 400 millivolt voltage drop across resistor 102, which is approximately equal to 300 millivolts. In this manner, clamp transistor 124 allows transistor 90 to conduct fully while at the same time prevents transistor 90 from being driven into a saturation condition.

Preventing transistor 90 from being driven into the saturation condition helps to insure symmetrical positive and positive going voltage transitions between the supply terminal 96 and each of output terminals 84 and 86. Once the transistor 90 goes into saturation it requires greater base drive to bring the transistor out of saturation. Therefore, greater base drive would be needed for transitions in one polarity than in the other polarity resulting in non-symmetrical transitions of the logic translating buffer 80. In addition, transistors 90 and 92, as well as the resistance of resistors 108 and 110, are preferably matched to provide an identical voltage swing at output terminals 84 and 86.

Resistor 126, connected between input terminal 82 and the base of transistor 88, is a current limiting resistor to prevent voltage surges during electrostatic discharge (ESD). Resistor 128, connected between the base of transistor 88 and the common terminal 98, pulls the base of transistor 88 to a low logic state when the input terminal is not connected to a logic signal, which is usually referred to as "floating."

A Schottky diode 130, having an anode and a cathode, is provided with the anode connected to positive terminal 96 and the cathode connected to each of resistor 126 and resistor 128 by each of epitaxial connections 132 and 134, respectively. The Schottky diode 130 and epitaxial connections 132 and 134 prevent parasitic devices from turning on if the voltage at the input terminal 82 becomes greater than the voltage between the positive terminal 96 and the common terminal 98.

In operation, TTL compatible signals are provided to the input terminal of the logic translator 80. TTL signals are known and their logic thresholds are well defined. Other logic families such as CMOS that are capable of providing a TTL compatible signal are also suitable for providing a signal to input terminal 82. The currents in the collector circuits of transistor 90 and transistor 92 are alternatively switched based on the voltage at the input terminal 82. As the current provided to current source transistor 94 is switched between transistor 90 and transistor 92, a varying output voltage is produced at output terminals 84 and 86. The output voltage at output terminals 84 and 86 varies corresponding to the voltage at input terminal 82. The output terminals 84 and 86 are electrically connected to the input terminals of logic elements that are suited to receive the current mode logic signal provided by logic translator 80.

The logic translator 80 of the present invention replaces the relatively large resistor 36 that is used to set the bias level shown in logic translator 10. Diode 10 is replaced with Schottky diode 104 and resistor 102 is added between the bases of transistors 124 and 92 in logic translator 80 thereby allowing proper operation at low supply voltages. The logic translator 80 requires that the supply voltage be sufficiently large so that transistor 90 is in the conducting state when a logic high signal is provided to input terminal 82. The supply voltage must be greater than the bias voltage supplied to the base of transistor 124, 1.30 volts, plus the forward bias voltage drop, 0.7 volts, of the PN junction between the base and emitter of transistor 124 to ensure transistor 90 conducts. Therefore, the supply voltage must be greater than 2.00 volts to ensure transistor 90 achieves the proper voltage swing to vary between conducting and non-conducting modes with transistor 124 properly clamping to prevent saturation.

Furthermore, the temperature coefficient of the Schottky diode 104 is not as large as the temperature coefficient of the base-emitter junction of transistors 106 and 124. Under worst case temperature conditions the voltage drops across the emitter base junction of transistors 124 and 106 is 0.85 volts and the voltage drop across the Schottky diode 104 is 0.80 volts. Therefore, under worst case temperature conditions, the minimum supply voltage is 2.50 volts providing greater headroom than the 3.25 minimum supply voltage provided by logic translator 10.

In addition, the voltage swing between the bases of transistors 90 and 92 is 300 millivolts for logic translator 80 and the voltage swing between the bases of transistors 24 and 26 of logic translator 10 is 700 millivolts. Assuming that the collector currents of transistors 28 and 94 are substantially the same, and both the base capacitance and the slew rate for the differential transistor pair 24 and 26 are substantially the same as the slew rate and base capacitance for the transistor pair 90 and 92, then the voltage transitions at the bases of transistors 90 and 92 of logic translator 80 will be faster for logic translator 80 than logic translator 10.

Figure 1:
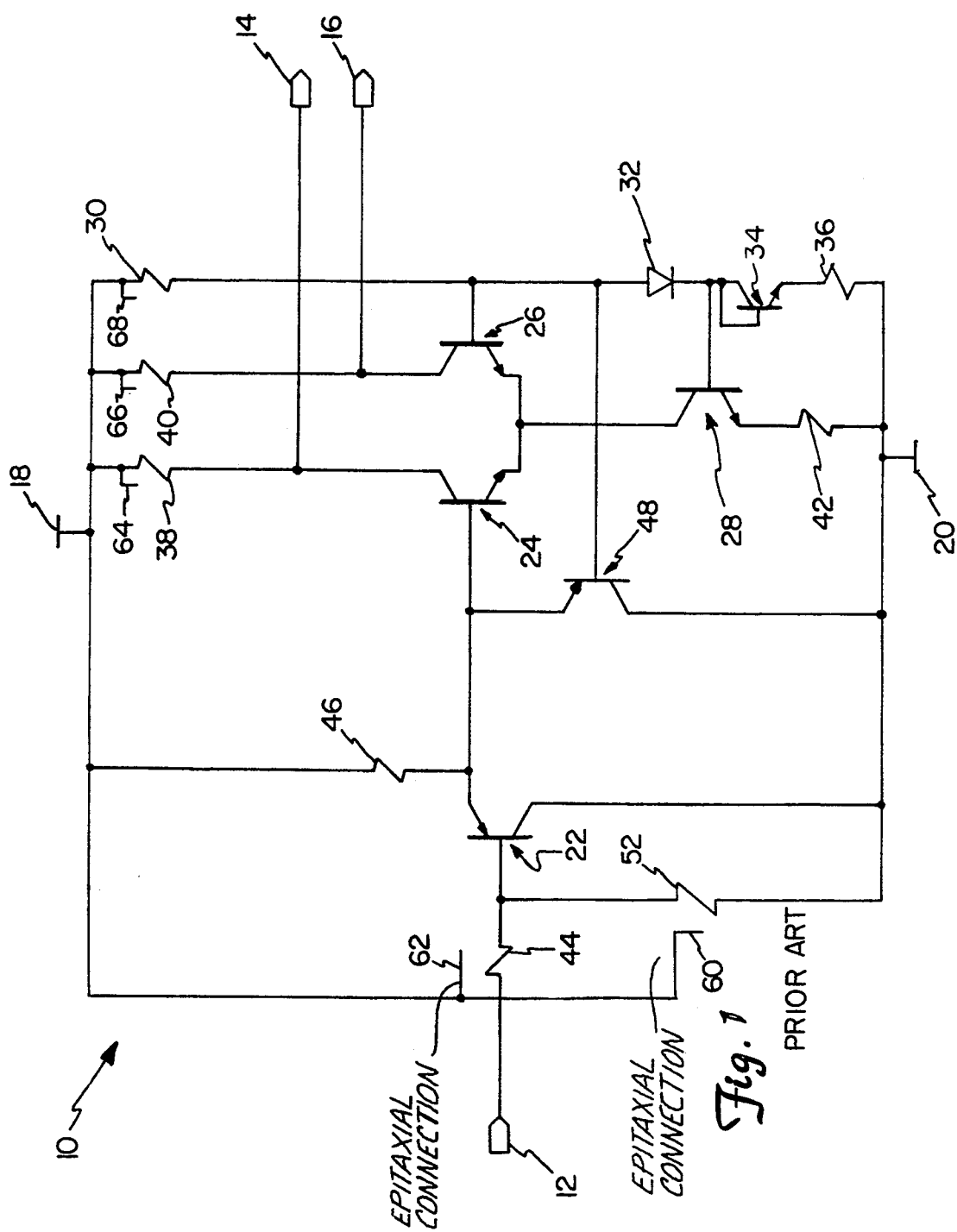
FIG. 1 is an electrical schematic diagram of a prior art input buffer suited for operation with a five-volt nominal supply.

Another advantage of the logic translator 80 of the present invention is that it tends not to "latch-up" or go into a high current drawing condition when the input terminal 82 becomes greater than the supply voltage. Latch-up is a condition that is known and is caused by the activation of parasitic devices on the integrated circuit. The logic translator 10 shown in FIG. 1 includes a pair of parasitic diodes (not shown) that have cathodes connected to terminal 18 and anodes each of which are connected to either side of resistors 44 and 52. As the input terminal 12 becomes greater than the supply voltage, the terminal voltages of resistors 44 and 52 will follow the voltage at the input terminal 12 thereby forward biasing the parasitic diodes and producing a low resistance path between the input terminal 12 and the terminal 18.

The logic translator 80 of the present invention makes use of a Schottky diode 130 that is connected to the tub contacts of resistors 126 and 128 for preventing conduction of relatively large currents between the input terminal 82 and the supply terminal 96. Because logic translator 10 does not include Schottky diode 130, relatively large currents can occur between the input terminal 12 and the supply terminal 18 if the voltage at the input terminal 12 is large enough to turn on the parasitic diode that is connected between the resistors 44 and 52, and the epitaxial connections 62 and 60, respectively. This high current condition may lead to excessive power dissipation or a latch-up condition, neither of which is desirable.

Although the present invention has been described with reference to preferred embodiments, workers skilled in the art will recognize that changes may be made in form and detail without departing from the spirit and scope of the invention.

What is claimed is:

1. A logic translator suited for low voltage operation comprising:
   a first input terminal for receiving an input signal having an input signal voltage relative to a common reference terminal;
   voltage reference means for providing a reference voltage relative to the common reference terminal at a first reference voltage terminal with the reference voltage having a magnitude that is less than a voltage equivalent to three times a magnitude of one diode drop;
   first and second transistors connected in a common emitter configuration between a supply terminal and the common reference terminal with the base of the first transistor connected to the first reference voltage terminal;
   current source means having a third transistor connected between the supply terminal and the base of the second transistor, a fourth transistor connected to the supply terminal, and a fifth transistor connected between the fourth transistor and the common reference terminal, the third and fourth transistors being arranged as a current mirror with the current in the third transistor being related to the current in the fourth transistor, the base of the fifth transistor being connected to the voltage reference means with the current in the fifth transistor being related to the current in the voltage reference means;
   switching means connected to the first input terminal and the base of the second transistor for allowing current to pass between the current source means and the common reference terminal based on the first input terminal voltage; and
   at least one output terminal for providing an output voltage based on one of the first and second transistor currents.

2. The logic translator of claim 1 further including second current source means connected between the supply terminal and the first reference voltage terminal, the voltage reference means comprises a resistor, a Schottky diode and a diode connected transistor connected in series between the common reference terminal and the first reference voltage terminal, the resistor is selected to have a resistance value such that a current passing between the supply terminal and the common reference terminal through the voltage reference means produces a voltage at the first reference voltage terminal approximately equal to 1.4 volts.

3. The logic translator of claim 1 wherein the current source means is configured to provide a voltage drop thereacross that is approximately equal to 700 millivolts.

4. The logic translator of claim 1 further including:
   a voltage clamp transistor connected between the base of the second transistor and the common reference terminal with the base of the voltage clamp resistor connected to the first reference voltage terminal; and
   voltage drop means connected between the base of the first transistor and the base of the voltage clamp transistor for providing a voltage drop thereacross so that a voltage between the bases of the first and second transistors has a magnitude that is less than a voltage equivalent to a magnitude of one diode drop.

5. The logic translator of claim 1 wherein the switching means is a transistor connected between the current source means and the common reference terminal with the base connected to the first input terminal.

6. The logic translator of claim 1 wherein the switching means is a PNP transistor connected between the current source means and the common reference terminal with the emitter connected to the current source means and the base connected to the first input terminal.

7. The logic translator of claim 1 wherein the current source means provides a current to the base of the second transistor that is independent of a supply voltage provided between the supply terminal and the common reference terminal.

8. A logic translator suited for low voltage operation comprising:
- a first input terminal for receiving an input signal having an input signal voltage relative to a common reference terminal;
- voltage reference means for providing a reference voltage relative to the common reference terminal at a first reference terminal;
- first and second transistors connected in a common emitter configuration between a supply terminal and the common reference terminal;
- a voltage clamp transistor connected between the base of the second transistor and the common reference terminal with the base of the voltage clamp transistor connected to the first reference terminal;
- voltage drop means connected between the base of the first transistor and the base of the voltage clamp transistor for providing a voltage drop thereacross so that a voltage between the bases of the first and second transistors has a magnitude that is less than a magnitude of a voltage equivalent to one diode drop;
- switching means connected to the second transistor for providing current thereto based on the input signal voltage; and
- at least one output terminal for providing an output voltage based on one of the first and second transistor currents.

9. The logic translator of claim 8 wherein the switching means further includes a current source means having at least one transistor connected between the supply terminal and the base of the second transistor for providing a current between the supply terminal and the second transistor.

10. The logic translator of claim 9 wherein the switching means is connected to the first input terminal and the base of the second transistor for allowing current to pass between the supply terminal and the common reference terminal based on the first input terminal voltage.

11. The logic translator of claim 10 wherein the current source means is a current mirror having a third transistor connected between the supply terminal and the common reference terminal, and a fourth transistor connected between the supply terminal and the switching means with the current in the third transistor being related to the current in the fourth transistor.

12. The logic translator of claim 8 wherein the voltage drop means is a resistor connected between the base of the second transistor and the base of the voltage clamp transistor.

13. The logic translator of claim 12 wherein the resistor is selected such that a current passing between the supply terminal and the common reference terminal through the resistor produces a voltage thereacross that has a magnitude that is less than a voltage equivalent to a magnitude of one diode drop.

14. The logic translator of claim 8 and further including a transistor connected between the emitters of the first and second transistors and the common reference terminal for providing a current path therebetween.

15. A logic translator suited for low supply voltage operation, the logic translator being capable of receiving a TTL compatible signal and providing a current mode logic signal based thereon, the logic translator comprising:
- a first input terminal for receiving a TTL compatible signal having a TTL compatible signal voltage relative to a common reference terminal;
- voltage reference means for providing a reference voltage relative to the common reference terminal at a first reference voltage terminal with the reference voltage having a magnitude that is less than a voltage equivalent to three times a magnitude of one diode drop;
- current switch means for selectively allowing current flow in a first and second collector circuit, the current switch means comprising:
    - first and second NPN transistors having emitters connected together with each NPN transistor having a base and with the first NPN transistor having a collector connected to the first collector circuit and the second NPN transistor having a collector connected to the second collector circuit and with the second NPN transistor having a base connected to the reference voltage means;
    - a third transistor having first and second controlled terminals and a control terminal with the first and second controlled terminals connected between the common reference terminal and the emitters of each of the first and second NPN transistors; and
    - control means for providing a control signal to the control terminal of the third transistor thereby allowing a current to pass between the first and second controlled terminals of the third transistor;
- voltage clamping means comprising:
    - a first PNP transistor having an emitter connected to the base of the first NPN transistor and a collector connected to the common reference terminal; and
    - a clamp circuit bias means connected between the base of the second NPN transistor and a base of the first PNP transistor for providing a bias voltage between the bases of the second NPN transistor and the first PNP transistor that has a magnitude that is less than a voltage equivalent to a magnitude of one diode drop; and
- switching means connected to the first input terminal and the base of the first NPN transistor for providing a base drive signal to the base of the first NPN transistor based on the TTL compatible signal voltage thereby selectively allowing current to pass between the collector and emitter of the first NPN transistor producing a current mode logic signal at the collector of one of the first NPN transistor collector and the second NPN transistor collector.

16. The logic translator of claim 15 further including current source means connected between the supply terminal and the first reference voltage terminal, the voltage reference means comprises a first resistor, a Schottky diode and a PN junction connected together in series between the common reference terminal and each of a current source and the first reference voltage terminal, the first resistor being selected so that current passing between the supply terminal and the common reference terminal through the voltage reference means provides a voltage at the first reference voltage terminal approximately equal to 1.4 volts.

17. The logic translator of claim 15 wherein the third transistor is an NPN transistor having an emitter connected to the common reference terminal and having a collector connected to the emitters of each of the first and second NPN transistors.

18. The logic translator of claim 15 wherein the control means is included in the voltage reference means and is a forward biased PN junction with the base of the third transistor connected to a P region of the PN junction and with an N region of the PN junction connected to the common reference terminal.

19. The logic translator of claim 15 wherein the switching means further includes:
a second PNP transistor having an emitter connected to the base of the first NPN transistor and a collector connected to the common reference terminal, the second PNP transistor having a base terminal connected to receive the TTL compatible signal; and
bias means connected to the emitter of the second PNP transistor for providing bias thereof.

20. The logic translator of claim 15 further comprising a diode means for preventing conduction of relatively large currents between the input terminal and the supply terminal if the input terminal voltage is substantially greater than the supply voltage.

21. The logic translator of claim 15 wherein at least one of the first and second collector circuits includes a first resistor connected between the collector and the supply voltage.

22. The logic translator of claim 15 further including a current limiting means connected between the first input terminal and the switching means for current limiting.

23. The logic translator of claim 15 further including a pull down means connected to the first input terminal for pulling the input terminal to an inactive state if the TTL compatible signal is floating.

24. A logic translator suited for low supply voltage operation, the logic translator being capable of receiving a TTL compatible signal and providing a current mode logic signal based thereon, the logic translator comprising:
a first input terminal for receiving a TTL compatible signal having a TTL compatible signal voltage relative to a common reference terminal;
voltage reference means for providing a reference voltage relative to the common reference terminal, the voltage reference means comprises a first resistor, a Schottky diode and a PN junction connected together in series between the common reference terminal and a current source with the reference voltage being equal to the sum of the voltage drops across each of the Schottky diode, the PN junction and the first resistor, the first resistor having a voltage drop thereacross that has a magnitude that is less than a voltage equivalent to a magnitude of one diode drop;
current switch means for selectively allowing current flow in a first and second collector circuit, the current switch means comprising:
first and second NPN transistors having emitters connected together with each NPN transistor having a base and with the first NPN transistor having a collector connected to the first collector circuit and the second NPN transistor having a collector connected to the second collector circuit and with the second NPN transistor having a base connected to the reference voltage means;
a third NPN type transistor having an emitter connected to the common reference terminal and having a collector connected to the emitters of each of the first and second NPN transistors; and
the third NPN transistor having a base connected to a region of the PN junction and a region of the PN junction being connected to the common reference terminal to provide a control signal to the base of the third NPN transistor thereby allowing a current to flow between the collector and emitter of the third NPN transistor;
current source means having a first PNP transistor connected between the supply terminal and the base of the first NPN transistor, a second PNP transistor connected to the supply terminal, and a fourth NPN transistor connected between the second PNP transistor and the common reference terminal, the first and second PNP transistors being arranged as a current mirror with the current in the first PNP transistor being related to the current in the second PNP transistor, the base of the fourth NPN transistor being connected to the region of the PN junction; and
switching means connected to the first input terminal and the base of the first NPN transistor for providing a base drive signal to the base of the first NPN transistor based on the TTL compatible signal voltage thereby selectively allowing current to pass between the collector and emitter of the first NPN transistor producing a current mode logic signal between the common reference terminal and one of the first NPN transistor collector and the second NPN transistor collector.

25. The logic translator of claim 24 wherein the switching means further includes:
a third PNP transistor having an emitter connected to the base of the first NPN transistor and a collector connected to the common reference terminal, the third PNP transistor having a base terminal connected to receive the TTL compatible signal; and
voltage clamping means connected to the base of the first NPN transistor for limiting voltage excursions.

26. The logic translator of claim 25 wherein the voltage clamping means comprises:
a fourth PNP transistor having an emitter connected to the base of the first NPN transistor and a collector connected to the common reference terminal; and
a clamp circuit bias means for providing a bias to a base of the fourth PNP transistor.

27. The logic translator of claim 24 wherein at least one of the first and second collector circuits includes a first resistor connected between the collector and the supply voltage.

28. The logic translator of claim 24 further including a current limiting means connected between the first input terminal and the switching means for current limiting.

29. The logic translator of claim 24 further including a pull down means connected to the first input terminal for pulling the input terminal to an inactive state if the TTL compatible signal is floating.

30. The logic translator of claim 24 wherein further comprising a diode means for preventing conduction of relatively large currents between the input terminal and the supply terminal if the input terminal voltage is substantially greater than the supply voltage.

* * * * *